United States Patent
Huang et al.

(10) Patent No.: US 6,443,351 B1
(45) Date of Patent: Sep. 3, 2002

(54) METHOD OF ACHIEVING SOLDER BALL COPLANARITY ON BALL GRID ARRAY INTEGRATED CIRCUIT PACKAGE

(75) Inventors: Chien Ping Huang, Hsinchu; Tzong Da Ho, Taichung, both of (TW)

(73) Assignee: Siliconware Precision Industries Co., Ltd. (TW)

( * ) Notice: Subject to any disclaimer, the term of this patent is extended or adjusted under 35 U.S.C. 154(b) by 0 days.

(21) Appl. No.: 09/579,992

(22) Filed: May 26, 2000

(51) Int. Cl.[7] ............................................. B23K 31/02
(52) U.S. Cl. .................. 228/103; 228/180.22; 228/246
(58) Field of Search ................................ 257/738, 737; 361/767, 768, 773, 774, 760; 228/103, 180.22, 180.21, 246; 29/840, 832

(56) References Cited

U.S. PATENT DOCUMENTS

| | | | |
|---|---|---|---|
| 3,871,014 A | * | 3/1975 | King et al. |
| 4,581,680 A | * | 4/1986 | Garner |
| 4,604,644 A | * | 8/1986 | Beckham et al. |
| 5,182,630 A | * | 1/1993 | Omi et al. |
| 5,315,485 A | * | 5/1994 | Magill et al. |
| 5,484,963 A | * | 1/1996 | Washino |
| 5,623,123 A | * | 4/1997 | Umehara |
| 5,641,946 A | | 6/1997 | Shim |
| 5,812,379 A | * | 9/1998 | Barrow |
| 5,859,474 A | * | 1/1999 | Dordi |
| 6,091,155 A | * | 7/2000 | Jonaidi |

* cited by examiner

Primary Examiner—M. Alexandra Elve
Assistant Examiner—Jonathan Johnson
(74) Attorney, Agent, or Firm—Peter F. Corless; Steven M. Jensen; Edwards & Angell, LLP

(57) ABSTRACT

A BGA (Ball Grid Array) package fabrication method is proposed for the purpose of achieving solder ball coplanarity on a warped BGA package, such as a concavely-warped BGA package or a convexly-warped BGA package. The proposed method is characterized in the provision of a plurality of variably-sized solder-ball pads over the bottom surface of the substrate, each solder-ball pad having a specified size predetermined in accordance with pre-measured package warpage and predetermined relation of solder ball height against pad size. This provision allows the use of a solder mask having fixed-size openings, as contrary to the prior art that uses a solder mask having variably-sized openings, to allow the implanted solder balls to achieve coplanarity and have strengthened shear for robust solder joint.

10 Claims, 3 Drawing Sheets

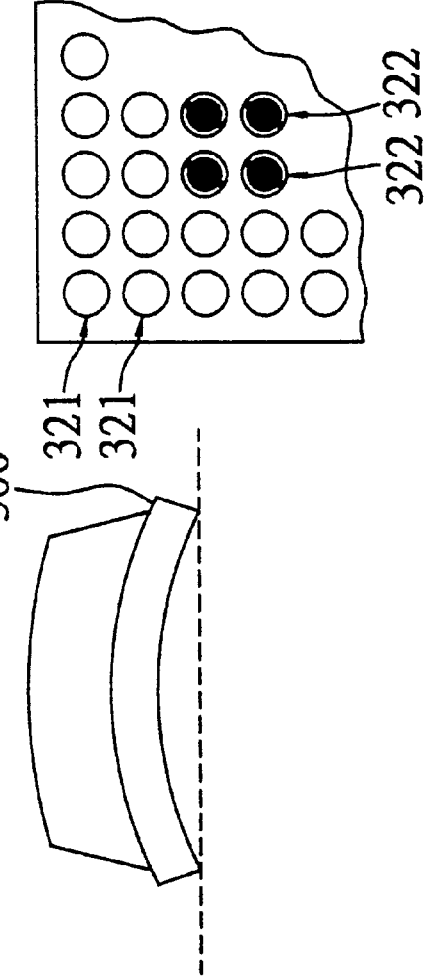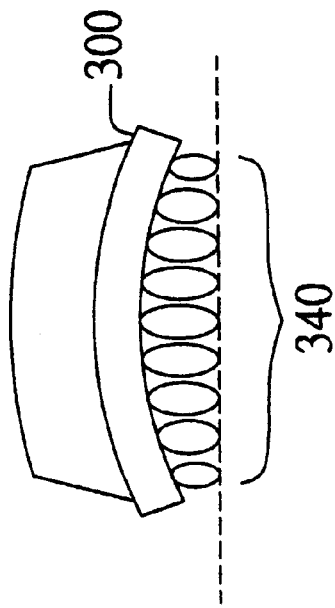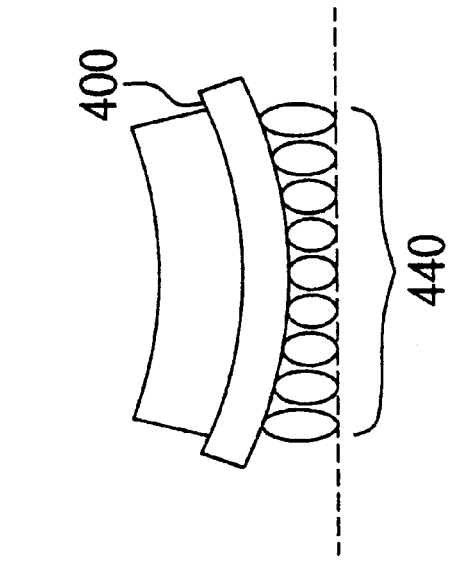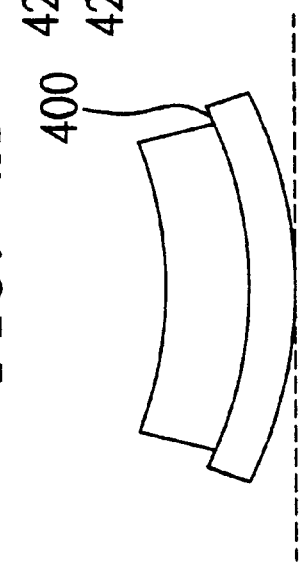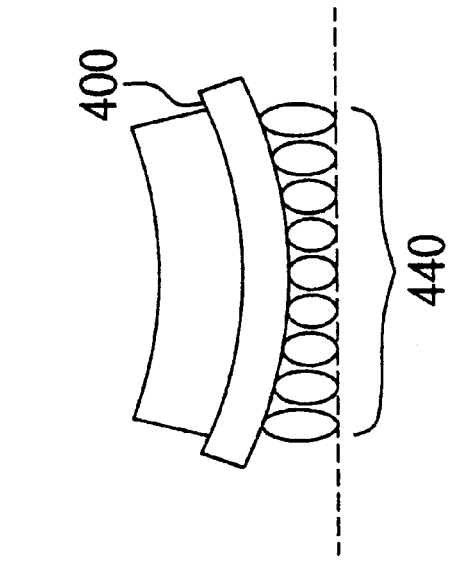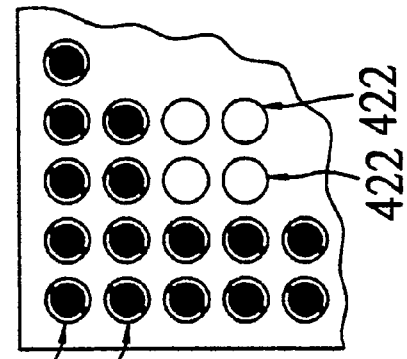

METHOD OF ACHIEVING SOLDER BALL COPLANARITY ON BALL GRID ARRAY INTEGRATED CIRCUIT PACKAGE

BACKGROUND OF THE INVENTION

1. Field of the Invention

This invention relates to integrated circuit packaging technology, and more particularly, to a method of achieving solder ball coplanarity on a BGA (Ball Grid Array) integrated circuit package.

2. Description of Related Art

A BGA integrated circuit package is an advanced type of integrated circuit package which is characterized in the provision of a two-dimensional array of solder balls on the bottom surface of the package body for mechanically bonding and electrically coupling the package body to a printed circuit board (PCB). Conventionally, an SMD (Solder Mask Define) method is used for the implantation of solder balls on the bottom surface of a BGA package. Fundamentally, it is strictly required that the implanted solder balls on the bottom surface of the BGA package be highly coplanarized so that the BGA package can be flatly mounted on the printed circuit board; otherwise, it would result in poor jointing of the solder balls with the electrically-conductive parts on the printed circuit board, making the mechanical bonding and electrical coupling of the BGA package unreliable to use. It is common that most BGA package bodies would suffer from warpage from mechanical or thermal stress before performing solder ball implantation.

Many patented methods have been proposed as a solution to the coplanarity problem, such as the U.S. Pat. No. 5,641,946. This patent is characterized in the use of a special SMD process with a solder mask having variably-sized openings to control the collapse of the implanted solder balls to thereby achieve solder ball coplanarity.

The foregoing patented method of U.S. Pat. No. 5,641,946, however, has the following drawbacks. First, the use of reduced mask openings in the SMD process would undesirably result in a poor ball shear and thus a poor solder joint. Second, since the resolution of solder balls defined by the solder mask is low, the use of variably-sized solder mask openings for solder ball height control would be highly complex in procedure, and thus is difficult to carry out.

SUMMARY OF THE INVENTION

It is therefore an objective of this invention to provide a new method for achieving solder ball coplanarity on a BGA package, which can achieve solder ball coplanarity without having to use a solder mask having variably-sized openings so that the overall fabrication process would be easy to carry out.

It is another objective of this invention to provide a new method for achieving solder ball coplanarity on a BGA package, which can achieve high solder ball shear for robust solder joint.

In accordance with the foregoing and other objectives, the invention proposes a new BGA package fabrication method that can achieve solder ball coplanarity on warped BGA packages, including concavely-warped and convexly-warped BGA packages. The method of the invention, broadly defined, comprises the following procedural steps: (1) determining in advance a relation of solder ball height against pad size; (2) measuring the warpage degree of the integrated circuit package; (3) preparing a substrate having a front surface for die attachment and a bottom surface for solder ball implantation; (4) forming a plurality of solder-ball pads over the bottom surface of the substrate, each solder-ball pad having a specified size predetermined in accordance with the measured package warpage from said step (2) and the relation of solder ball height against pad size from said step (1); (5) forming a solder mask having a plurality of fixed-size openings over the bottom surface of the substrate, each solder mask opening being aligned with one of the solder-ball pads on the substrate; and (6) performing a solder-ball implantation process to implant a plurality of solder balls through the solder mask openings onto the solder-ball pads on the substrate, the implanted solder balls substantially having coplanarity after reflow over the solder-ball pads.

The foregoing method of the invention is characterized in the provision of the array of variably-sized solder-ball pads over the bottom surface of the substrate, in which each solder-ball pad has a specified size predetermined in accordance with pre-measured package warpage and predetermined relation of solder ball height against pad size. This provision allows the use of a solder mask having fixed-size openings, as contrary to the prior art that uses a solder mask having variably-sized openings, while nevertheless allowing the implanted solder balls to achieve coplanarity and have robust solder joint.

BRIEF DESCRIPTION OF DRAWINGS

The invention can be more fully understood by reading the following detailed description of the preferred embodiments, with reference made to the accompanying drawings, wherein:

FIGS. 3A–3C are schematic diagrams used to depict how the method of the invention can be used to achieve solder ball coplanarity on a concavely-warped BGA package; and FIGS. 4A–4C are schematic diagrams used to depict how the method of the invention can be used to achieve solder ball coplanarity on a convexly-warped BGA package.

DETAILED DESCRIPTION OF PREFERRED EMBODIMENTS

The invention proposes a method for achieving solder ball coplanarity on a warped BGA package, such as a concavely-warped BGA package or a convexly-warped BGA package, which is characterized in the use of a plurality of variably-sized solder-ball pads together with a solder mask having fixed-size openings to help the implanted solder balls thereon to substantially achieve desired coplanarity.

Figure 1A:
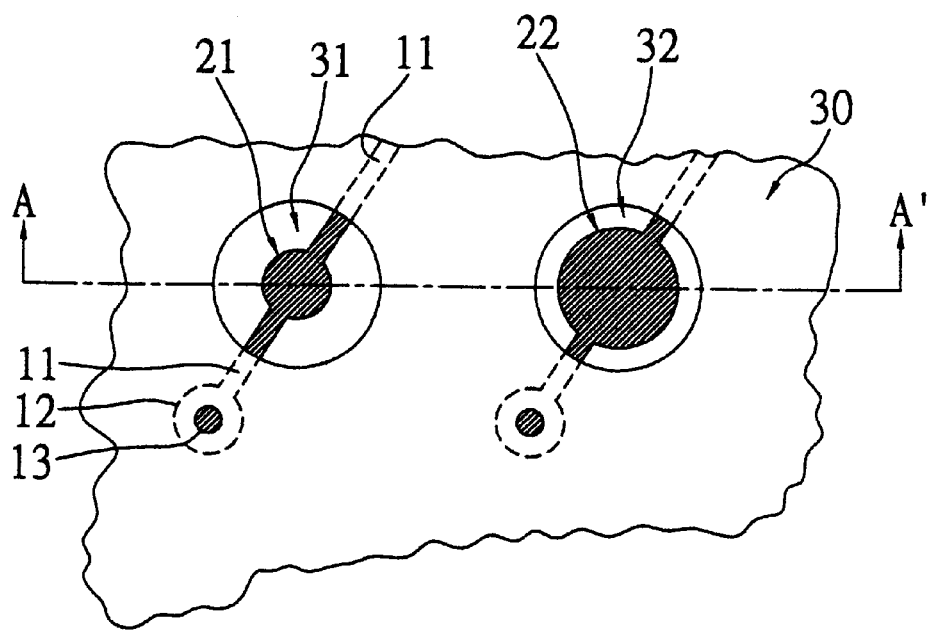
FIGS. 1A–1C are schematic diagrams used to depict the procedural steps involved in the method of the invention.
Figure 1B:
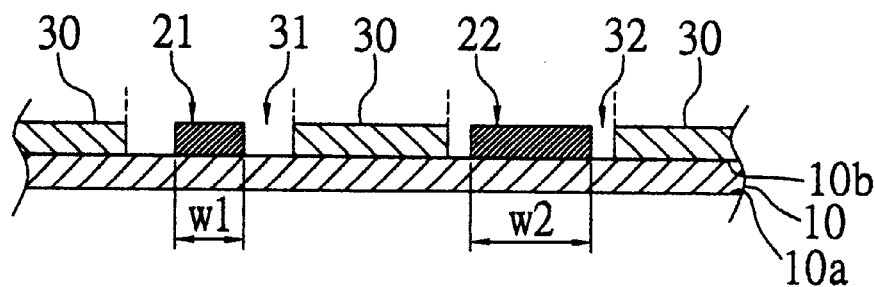
Figure 1C:
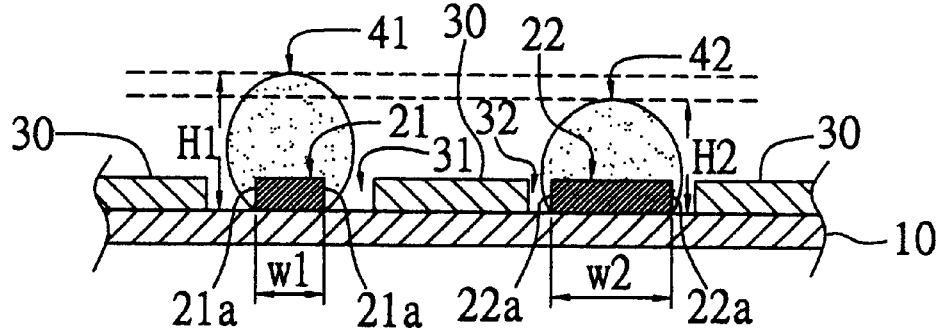

Detailed steps of the method of the invention are disclosed in full details in the following with reference to FIGS. 1A–1C; wherein FIG. 1A shows a schematic top view of the bottom surface of a BGA package where solder balls are to be implanted; FIG. 1B shows a schematic sectional view of the structure of FIG. 1A cutting through the line A–A'; and FIG. 1C is a schematic sectional diagram view used to depict the solder-ball implantation process. In the example of FIGS. 1A–1C, the invention is used for the fabrication of two solder balls of different heights so that on a warped BGA package, all the solder balls can achieve coplanarity.

Referring to FIG. 1A together with FIG. 1B, by the method of the invention, the first step is to prepare a BGA substrate 10 having a front surface 10a for die attachment and a bottom surface 10b for solder ball implantation (In FIG. 1B, the substrate 10 is turned upside down). The die attachment and encapsulation for the BGA package is performed on the front surface 10a of the substrate 10. Since the die attachment and encapsulation employs conventional processes and is not within the spirit and scope of the invention, both the attached semiconductor chip and the encapsulation body are not shown in the drawings and description thereof will not be further detailed.

In the next step, a plurality of f solder-ball pads are formed over the bottom surface 10b of the substrate 10 (only two are demonstratively shown, including a first solder-ball pad 21 and a second solder-ball pad 22). In practice, for example, the solder-ball pad array can be formed from a photoresist coating selectively removed through a conventional masked exposure, development, and etching process. Since photoresist coating allows high-resolution definition, the pad sizes can be variably defined with high precision. As shown in FIG. 1A, each solder-ball pad is electrically connected through an extended connecting line 11 to a via land 12 where a via 13 is formed. The via 13 is used to electrically connected the associated solder ball (to be implanted later) to the front surface 10a of the substrate 10.

Figure 2A:
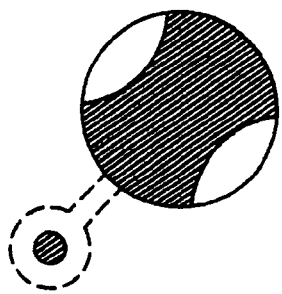
FIGS. 2A–2D are schematic diagrams respectively showing four other pad shapes that can be utilized by the invention.
Figure 2C:
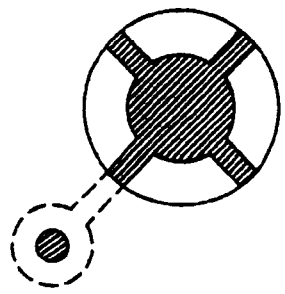
Figure 2B:
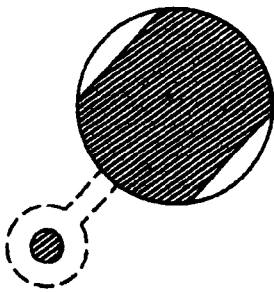
Figure 2D:
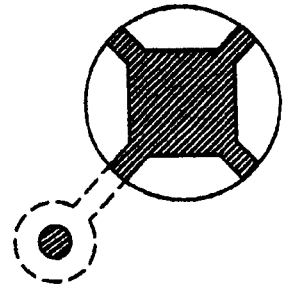

In the example of FIG. 1A, each solder-ball pad is formed with a circularly-shaped central portion with two radiating extended connecting lines. FIGS. 2A–2D are schematic diagrams respectively showing four other pad shapes that can be utilized by the invention. FIG. 2A shows a solder-ball pad having concavely-shaped lateral sides; FIG. 2B shows a solder-ball pad having straight parallel lateral sides; FIG. 2C shows a solder-ball pad having a circularly-shaped central portion with four radiating extended connecting lines; and FIG. 2D shows a solder-ball pad having a squarely-shaped central portion with four radiating extended connecting lines. Various other shapes are possible for the solder-ball pad.

It is a characteristic feature of the invention that each solder-ball pad has a specified size predetermined in accordance with pre-measured package warpage; i.e., if it is desired to increase the height of the solder ball implanted on a particular pad, then that particular solder-ball pad should be dimensioned to a smaller size; whereas, if it is desired to decrease the height, then the solder-ball pad should be dimensioned to a larger size. In the case of FIGS. 1A–1C, for example, assume it is desired to increase the height of the solder ball implanted on the first solder-ball pad 21 and decrease the height of the solder ball implanted on the second solder-ball pad 22, then the width $W_1$ of the first solder-ball pad 21 should be dimensioned smaller than the width $W_2$ of the second solder-ball pad 22. The relation of solder ball height H against pad width W can be easily predetermined through experimentation, which is apparent to those skilled in the art of integrated circuit package fabrication; and based on this H-to-W relation, suitable pad sizes can be predetermined in accordance with pre-measured package warpage.

In the next step, a solder mask 30 having a plurality of fixed-size openings, including a first opening 31 and a second opening 32, is formed over the bottom surface 10b of the substrate 10, with each solder mask opening being aligned to one of the pads on the substrate 10; i.e., the first opening 31 is aligned to the first solder-ball pad 21, while the second opening 32 is aligned to the second solder-ball pad 22. In practice, for example, the solder mask 30 is formed from a photo-image sensitive coating selectively removed through a masked exposure, development, and etching process.

Referring further to FIG. 1C. in the next step, a solder-ball implantation process is performed to implant a plurality of solder balls, including a first solder ball 41 and a second solder ball 42 respectively through the solder mask openings 31, 32 onto the solder-ball pads 21, 22. These solder balls typically have the same volume. During reflow, the first solder ball 41 will radially spread out over the surface of the first solder-ball pad 21 until the sidewall 21a of the first solder-ball pad 21 is completely covered thereby; and similarly, the second solder ball 42 will radially spread out over the surface of the second solder-ball pad 22 until the sidewall 22a of the second solder-ball pad 22 is completely covered thereby. Since these solder balls have the same volume, it is evident that the more widely spread solder ball would have a lower height than the less widely spread one. In the case of FIG. 1C, the second solder ball 42 would have a lower height than the first solder ball 41 ($H_2<H_1$) since the second solder-ball pad 22 is wider in size than the first solder-ball pad 21 ($W_2>W_1$), making the second solder ball 42 more widely spread than the first solder ball 41.

Therefore, it can be learned from the foregoing description that the implanted solder balls on the solder-ball pads can be variably adjusted in height by providing suitable pad sizes in accordance with pre-measured package warpage and predetermined relation of solder ball height H against pad width W to achieve the desired solder ball coplanarity on the BGA package. Since each implanted solder ball would reflow to the sidewall of the associated solder-ball pad, the invention can achieve strengthened ball shear to provide robust ball joint.

The utilization purpose of the invention is more clearly and understandably depicted in the following with reference to FIGS. 3A–3C and FIG. 4A–4C.

FIG. 3A shows a concavely-warped BGA package body 300. In this case, it is required to provide a greater solder ball height near the center of the bottom surface of the concavely-warped BGA package body 300. Therefore, as shown in FIG. 3B, the solution based on the invention for this problem is to form a plurality of conventional SMD pads 321 near the edge through the use of the conventional SMD method and a plurality of solder-ball pads 322 near the center. As further shown in FIG. 3C, through this arrangement, the implanted solder balls 340 can substantially achieve coplanarity that would allow the concavely-warped BGA package body 300 to be flatly mounted on a printed circuit board (not shown).

FIG. 4A shows a convexly-warped BGA package body 400. In this case, it is required to provide a greater solder ball height near the edge of the bottom surface of the concavely-warped BGA package body 400. Therefore, as shown in FIG. 4B, the solution based on the invention for this problem is to form a plurality of solder-ball pads 421 near the edge and a plurality of conventional SMD pads 422 near the center. As further shown in FIG. 4C, through this arrangement, the implanted solder balls 440 can substantially achieve coplanarity that would allow the convexly-warped B6A package body 400 to be flatly mounted on a printed circuit board (not shown).

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A method of achieving solder ball coplanarity on an integrated circuit package, comprising the steps of:
   (1) determining in advance the relation of solder ball height against pad size;
   (2) measuring the warpage degree of the integrated circuit package;
   (3) preparing a substrate having a front surface for die attachment and a bottom surface for solder ball implantation;
   (4) forming a plurality of solder-ball pads over the bottom surface of the substrate, each solder-ball pad having a specified size predetermined in accordance with the measured package warpage from said step (2) and the relation of solder ball height against pad size from said step (1);
   (5) forming a solder mask having a plurality of fixed-size openings over the bottom surface of the substrate, each solder mask opening behind aligned with one of the solder-ball pads on the substrate, wherein each solder mask opening is larger than the solder-ball pad retained therein; and
   (6) performing a solder-ball implantation process to implant a plurality of solder balls through the solder mask openings onto the solder-ball pads on the substrate, the implanted solder balls substantially having coplanarity after reflow over the solder-ball pads.

2. The method of claim 1, wherein in said step (4), the solder-ball pads are formed from a photoresist coating selectively removed through a masked exposure, development and etching process.

3. The method of claim 1, wherein in said step (4), each solder-ball pad is formed with a circularly-shaped central portion with two radiating connecting lines.

4. The method of claim 1, wherein in said step (4), each solder-ball pad is formed with two concavely-shaped lateral sides.

5. The method of claim 1, wherein in said step (4), each solder-ball pad is formed with two straight parallel lateral sides.

6. The method of claim 1, wherein in said step (4), each solder-ball pad is formed with a circularly-shaped central portion with four radiating connecting lines.

7. The method of claim 1, wherein in said step (4), each solder-ball pad is formed with a squarely-shaped central portion with four radiating connecting lines.

8. The method of claim 1, wherein in said step (5), the solder mask is formed from a photo-image sensitive coating selectively removed through a masked exposure, development, and etching process.

9. A method of achieving solder ball coplanarity on a concavely-warped integrated circuit package body, comprising the steps of:
   (1) determining in advance the relation of solder ball height against solder-ball pad size;
   (2) measuring the warpage degree of the concavely-shaped integrated circuit package body;
   (3) preparing a substrate having a front surface for die attachment and a bottom surface for solder ball implantation;
   (4) specifying a plurality of SMD areas over an edge portion of the bottom surface of the substrate;
   (5) forming a plurality of solder-ball pads over a center portion of the bottom surface of the substrate, each solder-ball pad having a specified size predetermined in accordance with the measured package warpage from said step (2) and the relation of solder ball height against pad size from said step (1);
   (6) forming a solder mask having a plurality of fixed-size openings over the bottom surface of the substrate, each solder mask opening being aligned with one of the SMD areas and solder-ball pads on the substrate, wherein each solder mask opening is larger than the solder-ball pad retained therein; and
   (7) performing a solder-ball implantation process to implant a plurality of solder balls through the solder mask openings onto the SMD areas and solder-ball pads on the substrate, the inplanted solder balls substantially having coplanarity after reflow.

10. A method of achieving solder ball coplanarity on a convexly-warped integrated circuit package body, comprising the steps of:
   (1) determining in advance the relation of solder ball height against solder-ball pad size;
   (2) measuring the warpage degree of the convexly-shaped integrated circuit package body;
   (3) preparing a substrate having a front surface for die attachment and a bottom surface for solder ball implantation;
   (4) forming a plurality of solder-ball pads over an edge portion of the bottom surface of the substrate, each solder-ball pad having a specified size predetermined in accordance with the measured package warpage from said step (2) and the relation of solder ball height against pad size from said step (1);
   (5) specifying a plurality of SMD areas over a center portion of the bottom surface of the substrate;
   (6) forming a solder mask having a plurality of fixed-size openings over the bottom surface of the substrate, each solder mask opening being aligned with one of the SMD areas and solder-ball pads on the substrate, wherein each solder mask opening is larger than the solder-ball pad retained therein; and
   (7) performing a solder-ball implantation process to implant a plurality of solder balls through the solder mask openings onto the SMD areas and solder-ball pads on the substrate, the implanted solder balls substantially having coplanarity after reflow.

* * * * *